(12) United States Patent
Happ et al.

(10) Patent No.: US 7,888,665 B2
(45) Date of Patent: Feb. 15, 2011

(54) INTEGRATED CIRCUIT INCLUDING MEMORY CELL HAVING CUP-SHAPED ELECTRODE INTERFACE

(75) Inventors: Thomas Happ, Dresden (DE); Jan Boris Philipp, Munich (DE)

(73) Assignee: Qimonda AG, Munich (DE)

( * ) Notice: Subject to any disclaimer, the term of this patent is extended or adjusted under 35 U.S.C. 154(b) by 245 days.

(21) Appl. No.: 12/195,964

(22) Filed: Aug. 21, 2008

(65) Prior Publication Data

US 2010/0044669 A1 Feb. 25, 2010

(51) Int. Cl.
*H01L 29/02* (2006.01)

(52) U.S. Cl. .................. 257/2; 257/3; 257/4; 257/295; 257/E31.029; 365/100; 365/113; 365/148; 365/163; 438/381; 438/900

(58) Field of Classification Search ........................ None
See application file for complete search history.

(56) References Cited

U.S. PATENT DOCUMENTS

| | | | |
|---|---|---|---|
| 7,348,620 | B2 | 3/2008 | Chiang et al. |
| 2006/0110888 | A1* | 5/2006 | Cho et al. ................... 438/385 |
| 2007/0051936 | A1 | 3/2007 | Pellizzer et al. |
| 2007/0158633 | A1 | 7/2007 | Lai et al. |
| 2008/0048168 | A1 | 2/2008 | Sato |
| 2008/0061282 | A1 | 3/2008 | Sato et al. |
| 2008/0067486 | A1 | 3/2008 | Karpov et al. |
| 2008/0090400 | A1* | 4/2008 | Cheek et al. ................ 438/597 |
| 2008/0128675 | A1 | 6/2008 | Magistretti et al. |
| 2009/0052230 | A1* | 2/2009 | Rajendran et al. ........... 365/163 |

OTHER PUBLICATIONS

"High Reliable 50nm Contact Cell Technology for 256MB PRAM", S. J. Ahn, et al., Advanced Technology Development, Process Development and Computer Aided Engineering Teams, Semiconductor Division R&D Div. Samsung Electronics Co., Ltd., 2005 Sym. on VLSI Technology Digest of Tech. Papers.
"Ovonic Unified Memory—A High-performance Nonvolatile Memory Technology for Stand Alone Memory and Embedded Applications", Manzur Gill, Intel Corporation, Tyler Lowrey, Ovonyx Corp., John Park, Azalea Corp. Proceedings of ISSCC, 2002.
"OUM—A 180 nm Nonvolatile Memory Cell Element Technology For Stand Alone and Embedded Applications", Stefan Lai (Intel) and Tyler Lowrey (Ovonyx), Intel Corporation, IEDM Technical Digest, 2001. p. 36.5.1-36.5.4.
"Full Integration of Highly Manufacturable 512MB PRAM based on 90nm Technology", J.H. Oh, et al., Advanced Technology Development and Process Development Team, Semiconductor R&D Div., Samsung Electronics Co., Ltd. IEDM '06, 2006, p. 1-4.
"Novel Lithography-Independent Pore Phase Change Memory", M. Breitwisch, et al., IBM Qimonda Macronix PCRM Joint Project, 2007 Symposium on VLSI Technology, 2007, pp. 100-101.

* cited by examiner

*Primary Examiner*—Evan Pert
*Assistant Examiner*—Scott Wilson
(74) *Attorney, Agent, or Firm*—Dicke, Billig & Czaja, PLLC

(57) ABSTRACT

An integrated circuit includes a first electrode and a cup-shaped electrode interface coupled to the first electrode. The integrated circuit includes a dielectric spacer at least partially laterally enclosed by the electrode interface and a resistance changing material laterally enclosed by the spacer and contacting the electrode interface. The integrated circuit includes a second electrode coupled to the resistance changing material.

24 Claims, 12 Drawing Sheets

INTEGRATED CIRCUIT INCLUDING MEMORY CELL HAVING CUP-SHAPED ELECTRODE INTERFACE

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change memory cell. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

For these and other reasons, there is a need for the present invention.

SUMMARY

One embodiment provides an integrated circuit. The integrated circuit includes a first electrode and a cup-shaped electrode interface coupled to the first electrode. The integrated circuit includes a dielectric spacer at least partially laterally enclosed by the electrode interface and a resistance changing material laterally enclosed by the spacer and contacting the electrode interface. The integrated circuit includes a second electrode coupled to the resistance changing material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
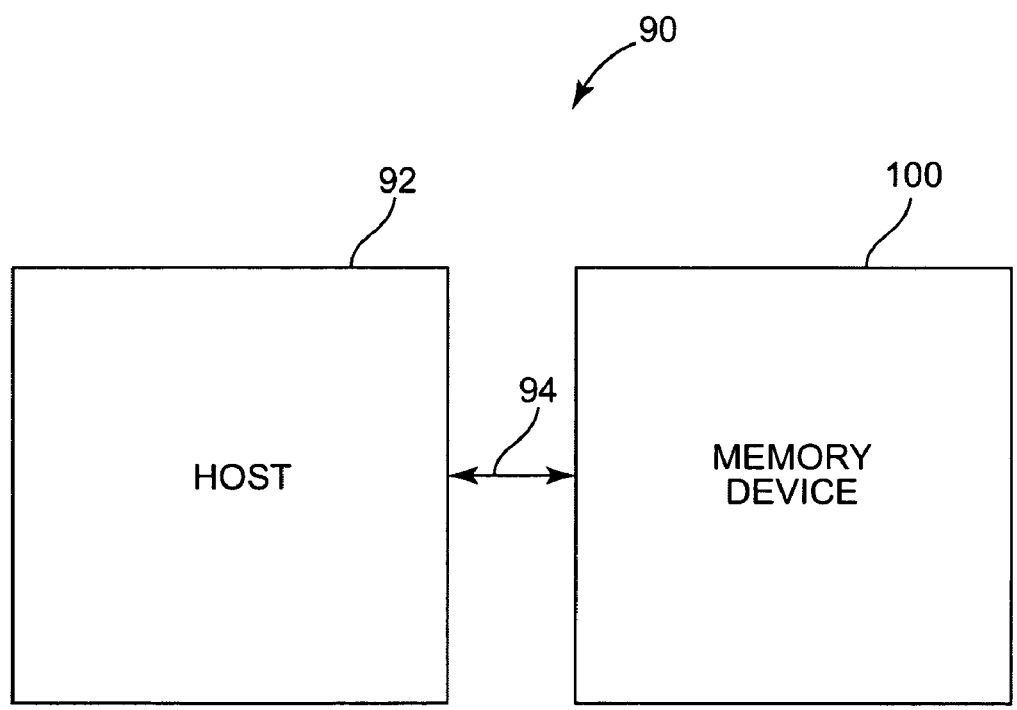
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or another suitable resistive or resistivity changing material memory device.

Figure 2:
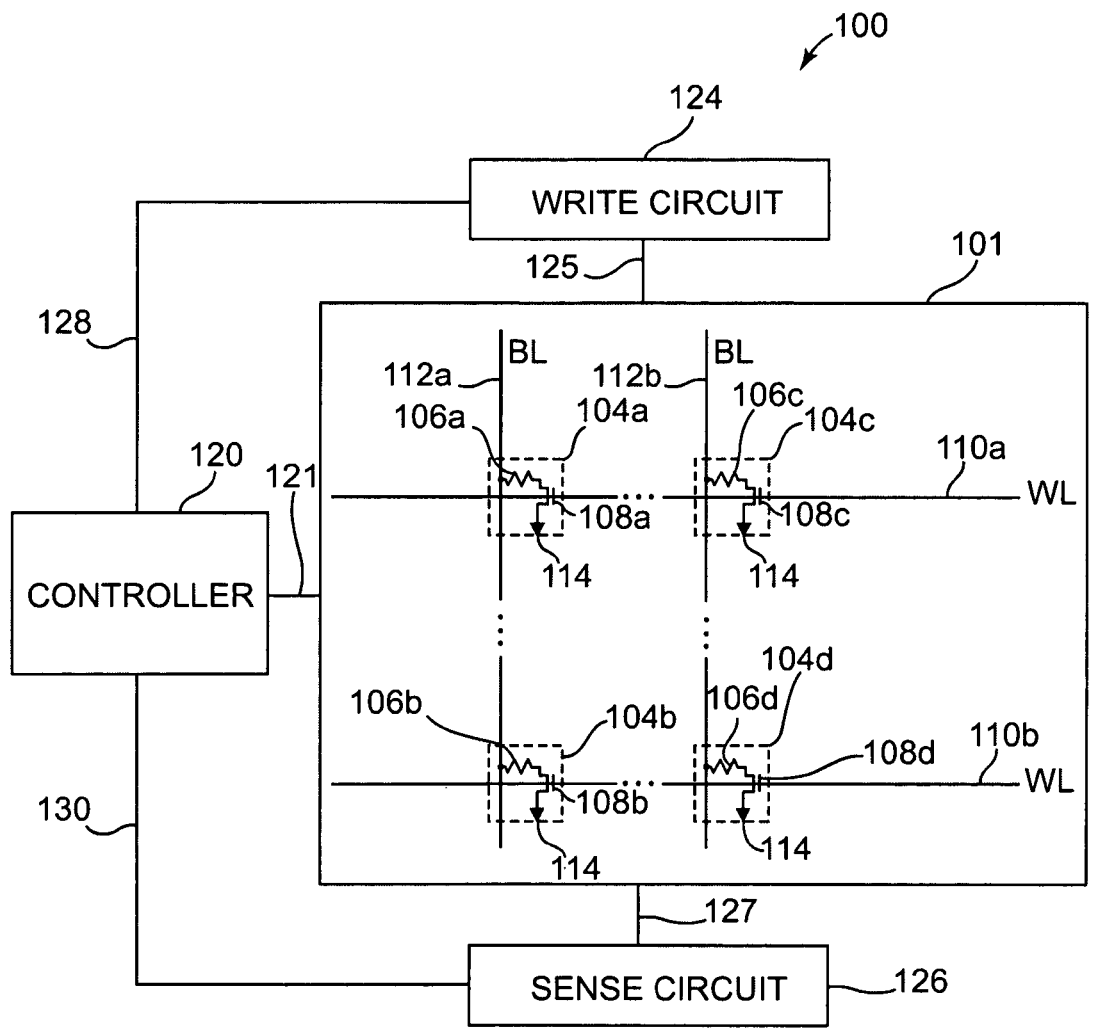
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 101, and a sense circuit 126. Memory array 101 includes a plurality of resistive memory cells 104a-104d (collectively referred to as resistive memory cells 104), a plurality of bit lines (BLs) 112a-112b (collectively referred to as bit lines 112), and a plurality of word lines (WLs) 110a-110b (collectively referred to as word lines 110). In one embodiment, resistive memory cells 104 are phase change memory cells.

In one embodiment, memory cells 104 are fabricated using a single block mask and a self-aligned process. Each memory cell 104 includes a cup-shaped electrode interface laterally surrounding a dielectric spacer. The dielectric spacer laterally surrounds a cylindrical-shaped phase change element, which contacts the electrode interface. The resulting memory cell structure provides a reduced reset current compared to mushroom and pore type memory cell structures.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114. Phase change memory cell 104b is electrically coupled to bit line 112a, word line 110b, and common or ground 114. Phase change memory cell 104c is electrically coupled to bit line 112b, word line 110a, and common or ground 114. Phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor, a thyristor, or a 3D transistor structure. In other embodiments, a diode or diode-like structure is used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a. The other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a. The other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b. The other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104*d* includes phase change element 106*d* and transistor 108*d*. One side of phase change element 106*d* is electrically coupled to bit line 112*b*. The other side of phase change element 106*d* is electrically coupled to one side of the source-drain path of transistor 108*d*. The other side of the source-drain path of transistor 108*d* is electrically coupled to common or ground 114. The gate of transistor 108*d* is electrically coupled to word line 110*b*.

In another embodiment, each phase change element 106 is electrically coupled to a common or ground 114 and each transistor 108 is electrically coupled to a bit line 112. For example, for phase change memory cell 104*a*, one side of phase change element 106*a* is electrically coupled to common or ground 114. The other side of phase change element 106*a* is electrically coupled to one side of the source-drain path of transistor 108*a*. The other side of the source-drain path of transistor 108*a* is electrically coupled to bit line 112*a*.

In one embodiment, each phase change element 106 includes a phase change material that may be made up of a variety of materials. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Bi, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106*a*-106*d* thereby defines two or more states for storing data within memory device 100. In the amorphous state, a phase change material exhibits significantly higher resistivity than in the crystalline state. Therefore, the two or more states of phase change elements 106*a*-106*d* differ in their electrical resistivity.

In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a reset operation of phase change memory cell 104*a*, word line 110*a* is selected to activate transistor 108*a*. With word line 110*a* selected, a reset current or voltage pulse is selectively enabled by write circuit 124 and sent through bit line 112*a* to phase change element 106*a*. The reset current or voltage quickly heats phase change element 106*a* above its melting temperature. After the current or voltage pulse is turned off, phase change element 106*a* quickly quench cools into the amorphous state or a partially amorphous and partially crystalline state.

During a set operation of phase change memory cell 104*a*, word line 110*a* is selected to activate transistor 108*a*. With word line 110*a* selected, one or more set current or voltage pulses are selectively enabled by write circuit 124 and sent through bit line 112*a* to phase change element 106*a*. The set current or voltage pulses heat phase change element 106*a* above its crystallization temperature (but usually below its melting temperature). In this way, phase change element 106*a* reaches the crystalline state or a partially crystalline and partially amorphous state during this set operation. Phase change memory cells 104*b*-104*d* and other phase change memory cells 104 in memory array 101 are set and reset similarly to phase change memory cell 104*a* using similar current or voltage pulses.

Figure 3A:
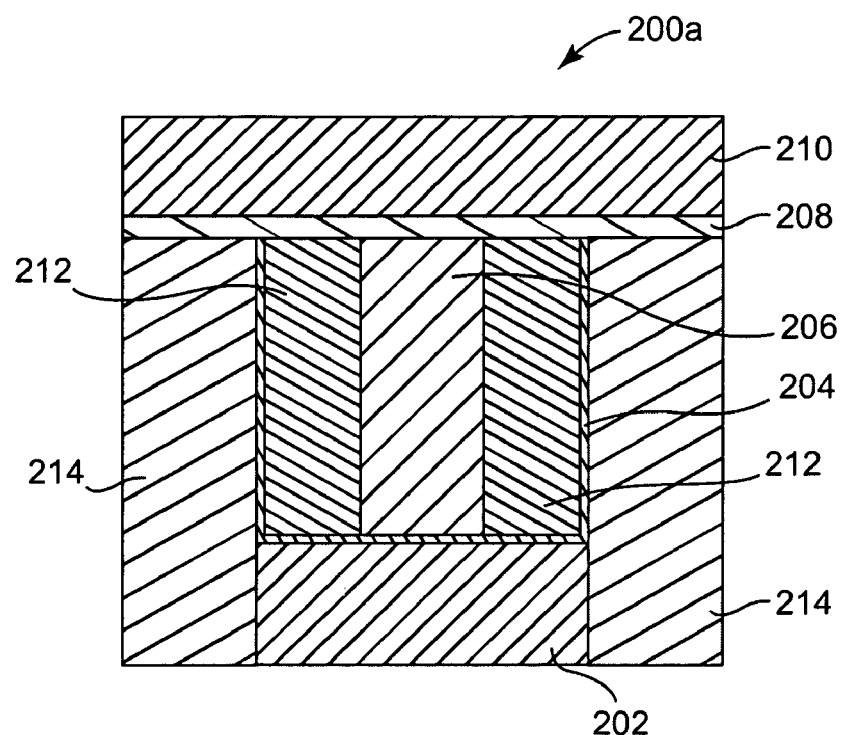
FIG. 3A illustrates a cross-sectional view of one embodiment of a memory cell.

FIG. 3A illustrates a cross-sectional view of one embodiment of a memory cell 200*a*. Memory cell 200*a* includes a first electrode 202, an electrode interface 204, a phase change element 206, a second electrode 208, a bit line 210, a spacer 212, and dielectric material 214. In one embodiment, memory cell 200*a* provides memory cells 104 as previously described and illustrated with reference to FIG. 2.

First electrode 202 includes W, Cu, Al, or another suitable electrode material. The top of first electrode 202 contacts the bottom of electrode interface 204. Electrode interface 204 includes TiN, TaN, W, Al, Ge, Si, Ta, TiSiN, TaSiN, TiAlN, TaAlN, WN, C, WO$_x$, or other suitable electrode interface material. Electrode interface 204 is substantially cup-shaped. The top of electrode interface 204 contacts the bottom of spacer 212, the bottom of phase change element 206, and the bottom of second electrode 208. The inner sidewall of electrode interface 204 contacts the outer sidewall of spacer 212.

Spacer 212 includes SiN or another suitable dielectric material. Spacer 212 is substantially pipe-shaped. The top of spacer 212 contacts the bottom of second electrode 208. The inner sidewall of spacer 212 contacts the sidewall of phase change element 206. Phase change element 206 is substantially cylindrical-shaped. Phase change element 206 includes a chalcogenide compound material or another suitable resistance changing material. The top of phase change element 206 contacts the bottom of second electrode 208.

Second electrode 208 includes TiN, TaN, W, Al, Ti, Ta, TiSiN, TaSiN, TiAlN, TaAlN, WN, C, Cu, or other suitable electrode material. The top of second electrode 208 contacts the bottom of bit line 210. Bit line 210 includes W, Cu, Al, or other suitable material. Dielectric material 214 contacts the sidewall of first electrode 202, the outer sidewall of electrode interface 204, and the bottom of second electrode 208. Dielectric material 214 includes $SiO_2$, $SiO_x$, SiN, SiON, $AlO_x$, FSG, BPSG, BSG, SiCN, SiCOH, or other suitable dielectric material.

In one embodiment, the resistivity of the material of electrode interface 204, which provides a shunt resistance, is greater than the resistivity of the material of phase change element 206 whether phase change element 206 is in a set state or a reset state. For example, in one embodiment, the reset resistance of phase change element 206 is between approximately 50 kΩ and 100 kΩ, the set resistance of phase change element 206 is between approximately 500Ω and 1 kΩ, and the shunt resistance is 200 kΩ or greater. Therefore, the shunt current path between first electrode 202 and second electrode 208 through electrode interface 204 does not have a significant effect on programming phase change element 206 to the set or reset state or on reading the state of phase change element 206.

Phase change element 206 provides a storage location for storing one or more bits of data. During operation of memory cell 200a, current or voltage pulses are applied between first electrode 202 and second electrode 208 to program the memory cell. During a set operation of memory cell 200a, one or more set current or voltage pulses are selectively enabled by write circuit 124 and sent to first electrode 202 or second electrode 208. From first electrode 202 or second electrode 208, the one or more set current or voltage pulses pass through electrode interface 204 and phase change element 206 thereby heating the phase change material above its crystallization temperature (but usually below its melting temperature). In this way, the phase change material reaches a crystalline state or a partially crystalline and partially amorphous state during the set operation.

During a reset operation of memory cell 200a, a reset current or voltage pulse is selectively enabled by write circuit 124 and sent to first electrode 202 or second electrode 208. From first electrode 202 or second electrode 208, the reset current or voltage pulse passes through electrode interface 204 and phase change element 206. The reset current or voltage quickly heats the phase change material above its melting temperature. After the current or voltage pulse is turned off, the phase change material quickly quench cools into an amorphous state or a partially amorphous and partially crystalline state.

Figure 3B:
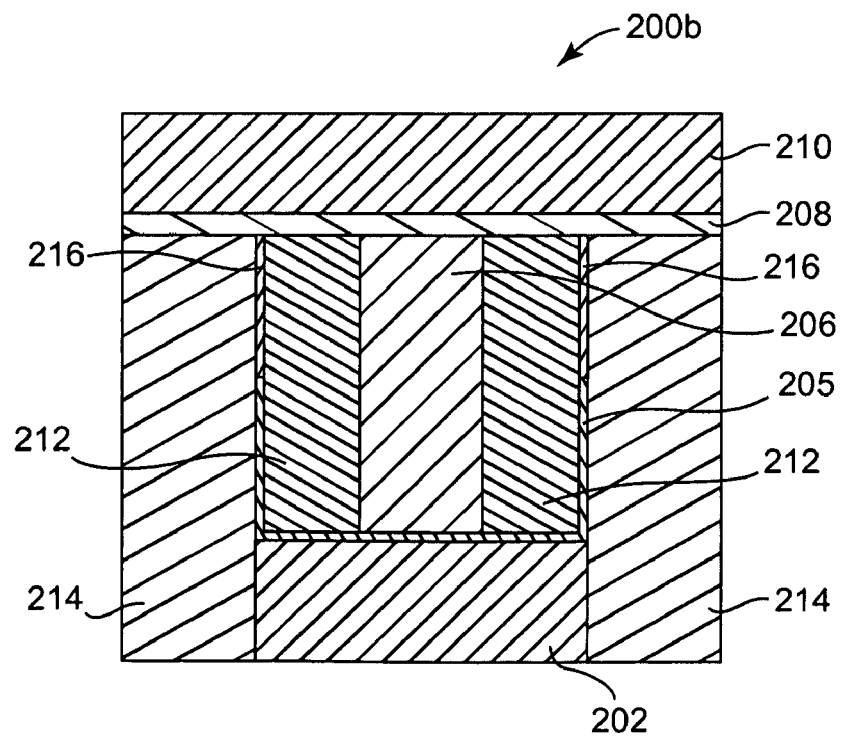
FIG. 3B illustrates a cross-sectional view of another embodiment of a memory cell.

FIG. 3B illustrates a cross-sectional view of another embodiment of a memory cell 200b. In one embodiment, memory cell 200b provides memory cells 104 as previously described and illustrated with reference to FIG. 2. Memory cell 200b is similar to memory cell 200a previously described and illustrated with reference to FIG. 3A, except that memory cell 200b includes electrode interface 205 and dielectric material 216. Dielectric material 216 includes an oxide, SiN, SiON, FSG, BPSG, BSG, or other suitable dielectric material. Dielectric material 216 is substantially pipe-shaped. The bottom of dielectric material 216 contacts the top of electrode interface 205. The inner sidewall of dielectric material 216 contacts the outer sidewall of spacers 212. The outer sidewall of dielectric material 216 contacts dielectric material 214. The top of dielectric material 216 contacts the bottom of second electrode 208.

Dielectric material 216 breaks the shunt current path from first electrode 202 to second electrode 208 through electrode interface 205. Therefore, in this embodiment, the resistivity of the material of electrode interface 205 does not need to be greater than the resistivity of the material of phase change element 206 whether phase change element 206 is in a set state or a reset state. Memory cell 200b is programmed similarly to memory cell 200a previously described and illustrated with reference to FIG. 3A.

The following FIGS. 4-18B illustrate embodiments for fabricating memory cell 200a previously described and illustrated with reference to FIG. 3A and memory cell 200b previously described and illustrated with reference to FIG. 3B.

Figure 4:
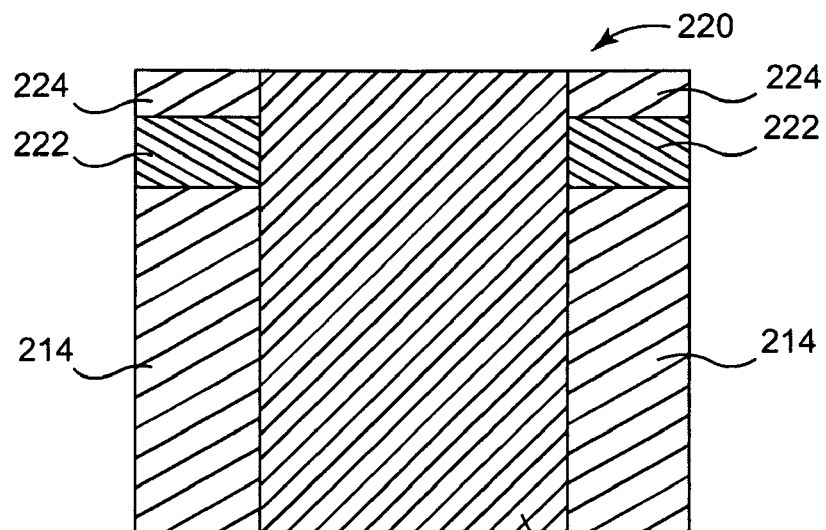
FIG. 4 illustrates a cross-sectional view of one embodiment of a preprocessed wafer.

FIG. 4 illustrates a cross-sectional view of one embodiment of a preprocessed wafer 220. Preprocessed wafer 220 includes a contact 202a to a selection device (not shown), such as a transistor 108, a diode, or another suitable selection device, and dielectric material 214, 222, and 224. Dielectric material 214, 222, and 224 laterally surround contact 202a. Dielectric material 214 and 224 include SiN or another suitable dielectric material. Dielectric material 222 includes $SiO_2$, $SiO_x$, SiON, $AlO_x$, FSG, BPSG, BSG, or other suitable dielectric material. In one embodiment, dielectric material 222 is excluded and contact 202a is laterally surrounded by dielectric material 214 and 224.

Contact 202a includes W, Cu, Al, or another suitable contact material. In one embodiment, contact 202a is fabricated using a self-aligned double patterning process having approximately a 2 nm critical dimension control. In one embodiment, contact 202a is substantially cylindrical-shaped or substantially square-shaped and has a width between approximately 20 nm and 100 nm, such as 30 nm, 50 nm, or 80 nm.

Figure 5A:
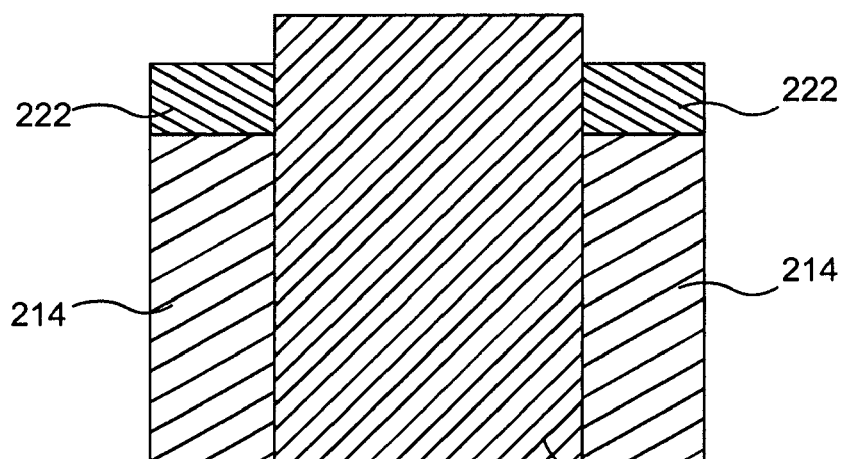
FIG. 5A illustrates a cross-sectional view of one embodiment of the preprocessed wafer after etching.
Figure 5B:
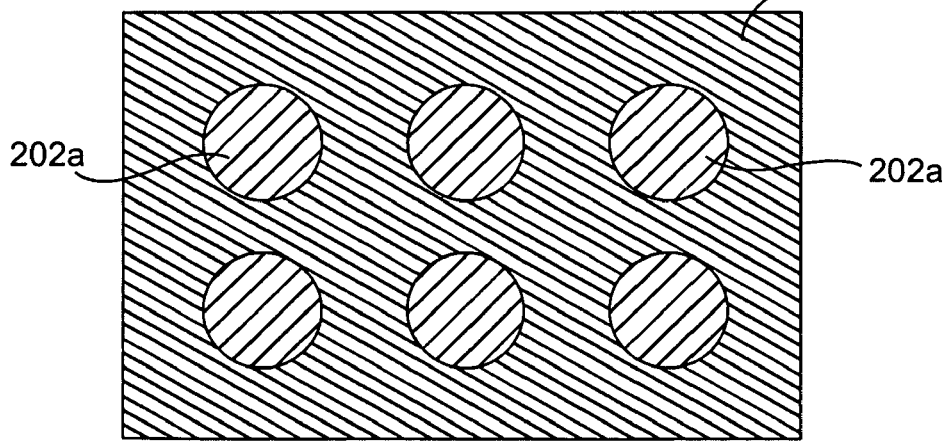
FIG. 5B illustrates a top view of one embodiment of the preprocessed wafer after etching.

FIG. 5A illustrates a cross-sectional view and FIG. 5B illustrates a top view of one embodiment of preprocessed wafer 220 after etching dielectric material 224. Dielectric material 224 is selectively etched to expose dielectric material 222. Each contact 202a in an array of contacts 202a arranged in rows and columns is laterally surrounded by dielectric material 214 and 222. In other embodiments, other array arrangements such as staggered columns or rows can be used.

Figure 6:
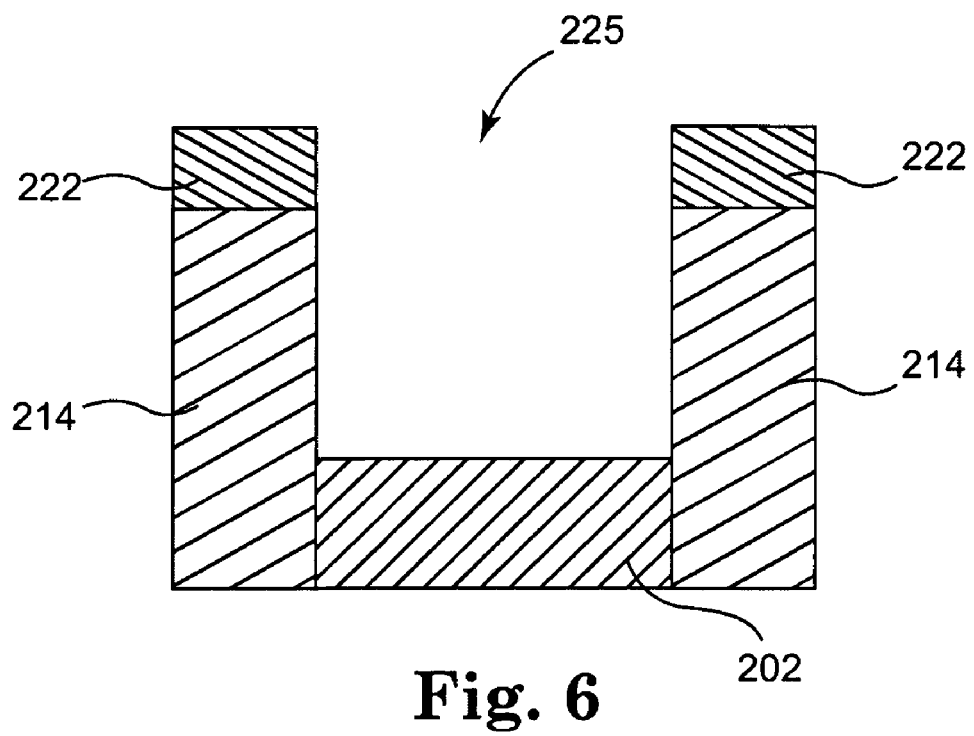
FIG. 6 illustrates a cross-sectional view of one embodiment of a first electrode.

FIG. 6 illustrates a cross-sectional view of one embodiment of a first electrode 202. An array block mask is used to define the contacts 202a where memory cells are to be fabricated. Each selected contact 202a is recess etched to provide opening 225 and first electrode 202. In one embodiment, contact 202a is etched using a reactive ion etch or another suitable etch.

Figure 7:
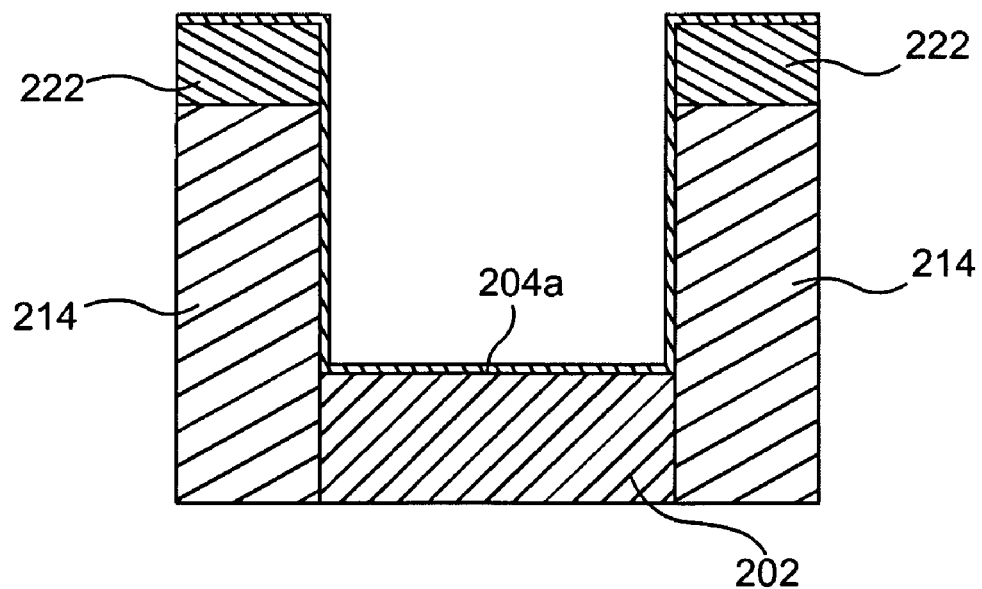
FIG. 7 illustrates a cross-sectional view of one embodiment of the first electrode and an electrode interface material layer.

FIG. 7 illustrates a cross-sectional view of one embodiment of first electrode 202 and an electrode interface material layer 204a. An electrode or heater material, such as TiN, TaN, W, Al, Ge, Si, Ta, TiSiN, TaSiN, TiAlN, TaAlN, WN, C, $WO_x$, or other suitable electrode or heater material is deposited over exposed portions of dielectric material 222 and 214 and first electrode 202 to provide electrode interface material layer 204a. Electrode interface material layer 204a is deposited using chemical vapor deposition (CVD), high density plasma-chemical vapor deposition (HDP-CVD), atomic layer deposition (ALD), metal organic chemical vapor deposition (MOCVD), plasma vapor deposition (PVD), jet vapor deposition (JVD), or other suitable deposition technique. In one embodiment, electrode interface material layer 204a is deposited to a thickness between approximately 1 nm and 20 nm.

Figure 8:
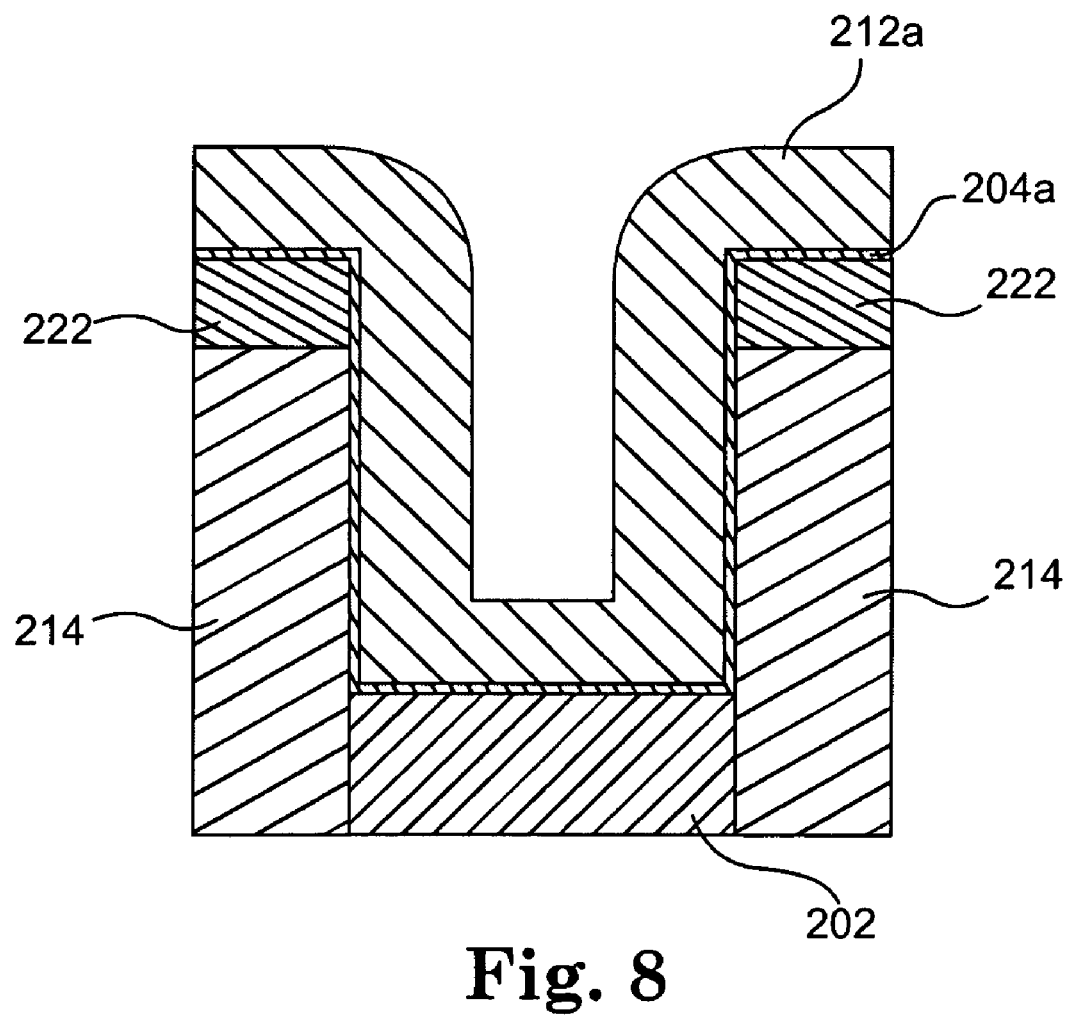
FIG. 8 illustrates a cross-sectional view of one embodiment of the first electrode, the electrode interface material layer, and a spacer material layer.

FIG. 8 illustrates a cross-sectional view of one embodiment of first electrode 202, electrode interface material layer 204a, and a spacer material layer 212a. A dielectric material, such as SiN or another suitable dielectric material is deposited over electrode interface material layer 204a to provide spacer material layer 212a. Spacer material layer 212a is deposited using CVD, HDP-CVD, ALD, MOCVD, PVD, JVD, or other suitable deposition technique. In one embodiment, spacer material layer 212a is deposited to a thickness between approximately 5 nm and 50 nm.

Figure 9A:
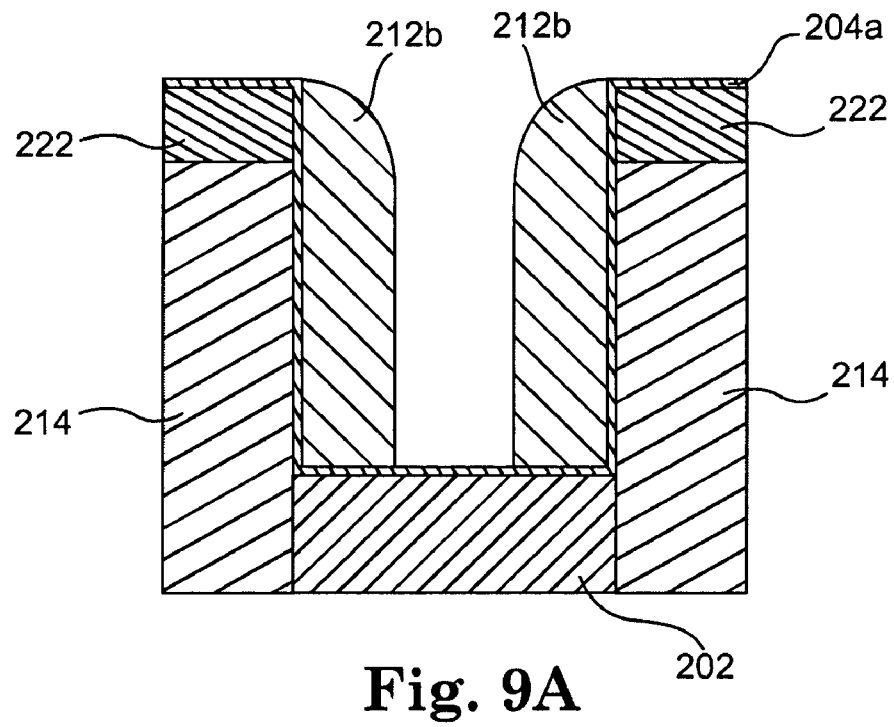
FIG. 9A illustrates a cross-sectional view of one embodiment of the first electrode, the electrode interface material layer, and a spacer after etching.
Figure 9B:
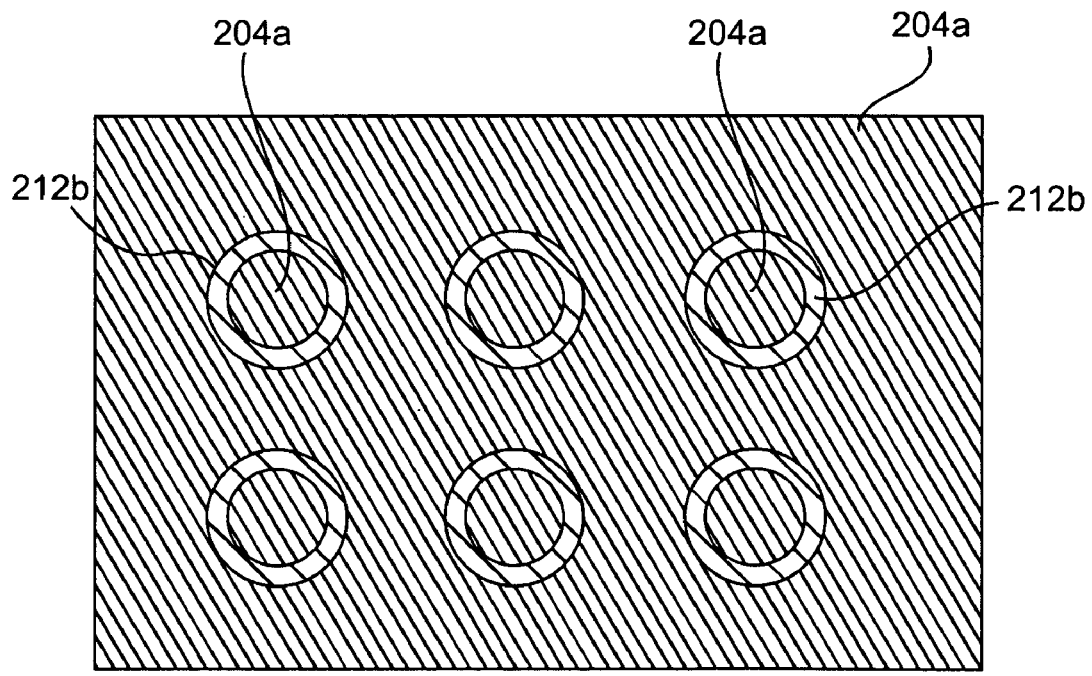
FIG. 9B illustrates a top view of one embodiment of the first electrode, the electrode interface layer, and the spacer after etching.

FIG. 9A illustrates a cross-sectional view and FIG. 9B illustrates a top view of one embodiment of first electrode 202, electrode interface material layer 204a, and a spacer 212b after etching spacer material layer 212a. Spacer material layer 212a is spacer etched to expose portions of electrode interface material layer 204a above dielectric material 222 and above first electrode 202 and to provide spacer 212b. Spacer 212b is substantially pipe-shaped.

Figure 10:
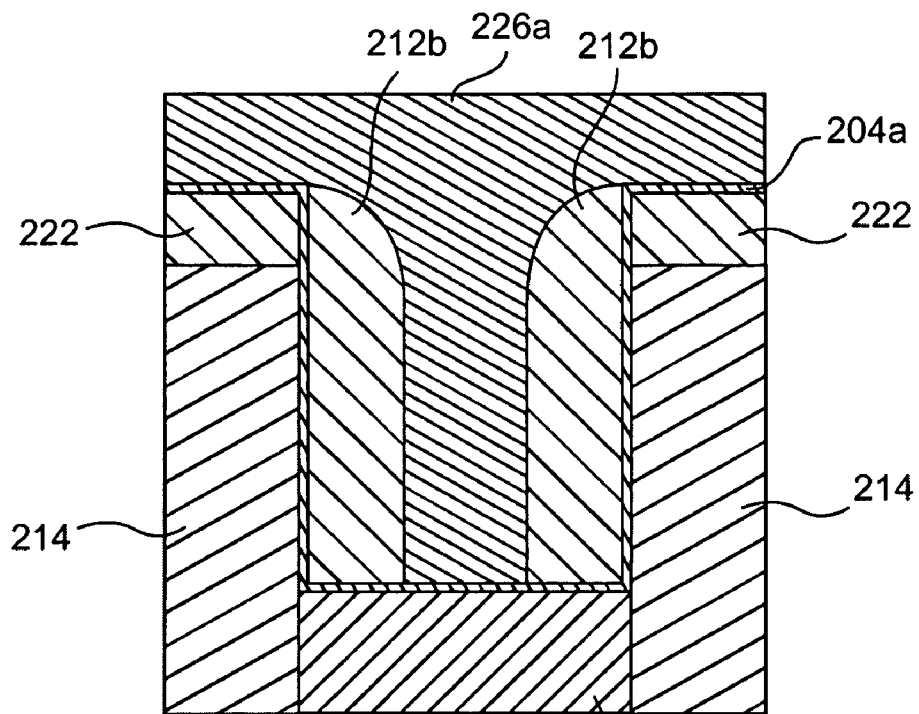
FIG. 10 illustrates a cross-sectional view of one embodiment of the first electrode, the electrode interface material layer, the spacer, and a sacrificial material layer.

FIG. 10 illustrates a cross-sectional view of one embodiment of first electrode 202, electrode interface material layer 204a, spacer 212b, and a sacrificial material layer 226a. A sacrificial material, such as $SiO_2$, $SiO_x$, FSG, BPSG, BSG, spin-on glass (SOG), NFC, resist, or other suitable sacrificial material is deposited over exposed portions of electrode interface material layer 204a and spacer 212b to provide sacrificial material layer 226a. Sacrificial material layer 226a is deposited using CVD, HDP-CVD, ALD, MOCVD, PVD, JVD, spin-on, or other suitable deposition technique.

Figure 11:
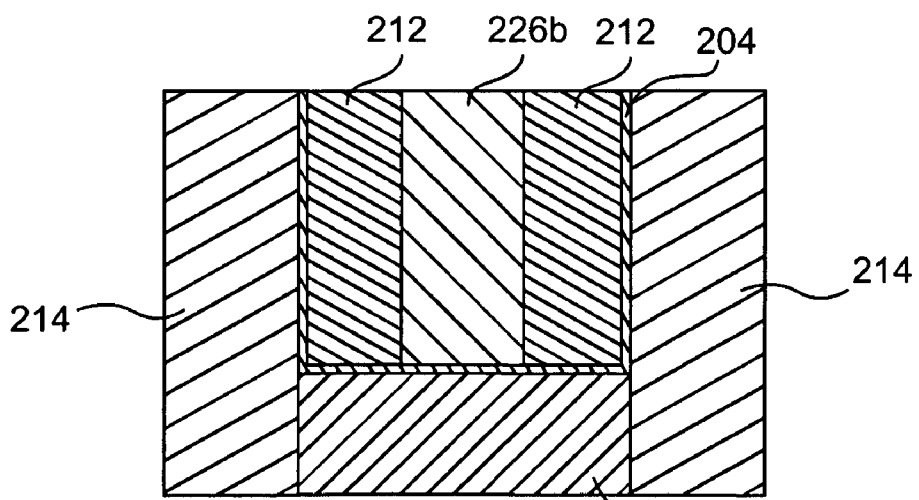
FIG. 11 illustrates a cross-sectional view of one embodiment of the first electrode, an electrode interface, the spacer, and the sacrificial material after planarization.

FIG. 11 illustrates a cross-sectional view of one embodiment of first electrode 202, an electrode interface 204, a spacer 212, and sacrificial material 226b after planarization. Sacrificial material layer 226a, electrode interface material layer 204a, spacer 212b, and dielectric material 222 are planarized to expose dielectric material 214 and to provide sacrificial material 226b, spacer 212, and electrode interface 204. Sacrificial material layer 226a, electrode interface material layer 204a, spacer 212b, and dielectric material 222 are planarized using chemical mechanical planarization (CMP) or another suitable planarization technique. In one embodiment, dielectric material 214 provides a planarization stop. After planarization, electrode interface 204 is substantially cup-shaped.

Figure 12:
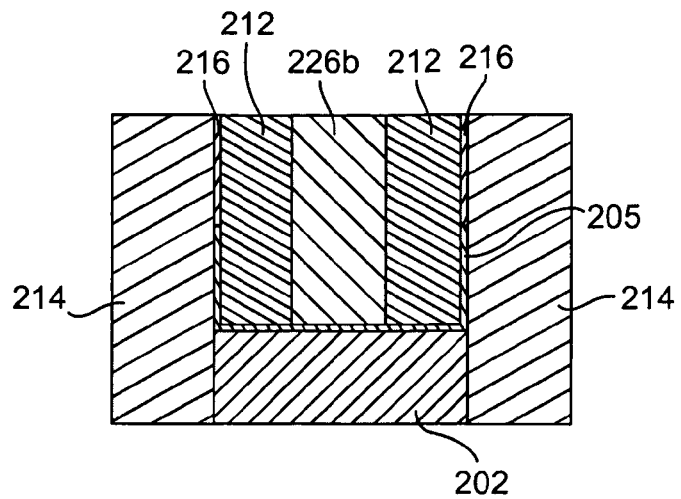
FIG. 12 illustrates a cross-sectional view of one embodiment of the first electrode, an electrode interface, the spacer, the sacrificial material, and a dielectric material after oxidation.
Figure 13:
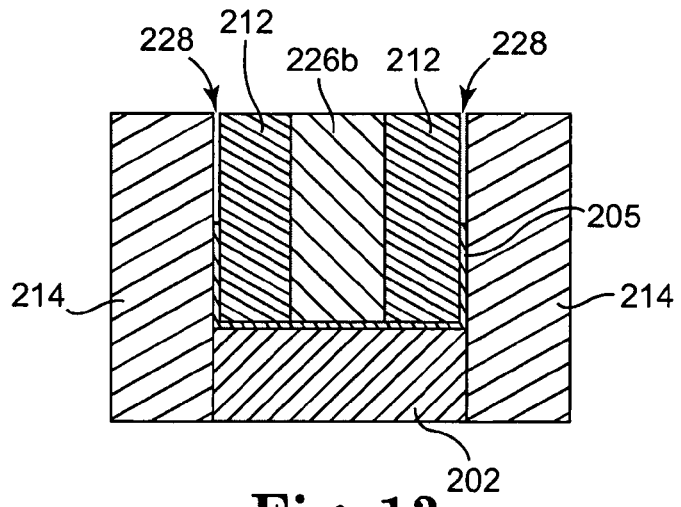
FIG. 13 illustrates a cross-sectional view of one embodiment of the first electrode, an electrode interface, the spacer, and the sacrificial material after etching.
Figure 14:
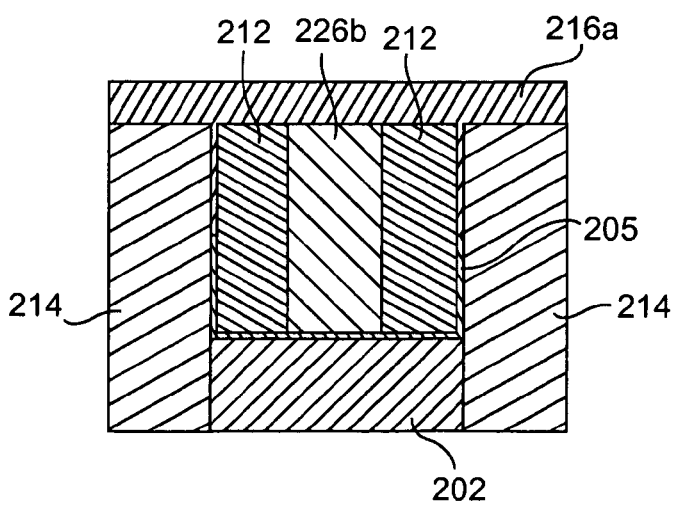
FIG. 14 illustrates a cross-sectional view of one embodiment of the first electrode, the electrode interface, the spacer, the sacrificial material, and a dielectric material layer.

The following FIGS. 12-14 illustrate embodiments for fabricating memory cell 200b previously described and illustrated with reference to FIG. 3B. To fabricate memory cell 200a previously described and illustrated with reference to FIG. 3A, FIGS. 12-14 may be excluded.

FIG. 12 illustrates a cross-sectional view of one embodiment of first electrode 202, an electrode interface 205, spacer 212, sacrificial material 226b, and a dielectric material 216 after oxidation of a portion of electrode interface 204. In one embodiment, an upper portion of electrode interface 204 is oxidized to provide electrode interface 205 and dielectric material 216.

FIG. 13 illustrates a cross-sectional view of one embodiment of first electrode 202, electrode interface 205, spacer 212, and sacrificial material 226b after etching a portion of electrode interface 204. In one embodiment, instead of oxidizing a portion of electrode interface 204 as previously described and illustrated with reference to FIG. 12, a portion of electrode interface 204 is selectively etched to provide opening 228 and electrode interface 205.

FIG. 14 illustrates a cross-sectional view of one embodiment of first electrode 202, electrode interface 205, spacer 212, sacrificial material 226b, and a dielectric material layer 216a. A dielectric material, such as $SiO_2$, $SiO_x$, SiN, SiON, $AlO_x$, FSG, BPSG, BSG, or other suitable dielectric material is deposited over exposed portions of electrode interface 205, spacer 212, sacrificial material 226b, and dielectric material 214 to provide dielectric material layer 216a. Dielectric material layer 216a deposited using CVD, HDP-CVD, ALD, MOCVD, PVD, JVD, spin-on, or other suitable deposition technique.

Dielectric material layer 216a is then planarized to expose spacer 212, sacrificial material 226b, and dielectric material 214 to provide dielectric material 216 as previously described and illustrated with reference to FIG. 12. Dielectric material layer 216a is planarized using CMP or another suitable planarization technique.

Although the following FIGS. 15-18B illustrate embodiments using electrode interface 204 as previously described and illustrated with reference to FIG. 11, the described fabrication process is also applicable when using electrode interface 205 and dielectric material 216 as previously described and illustrated with reference to FIG. 12.

Figure 15:
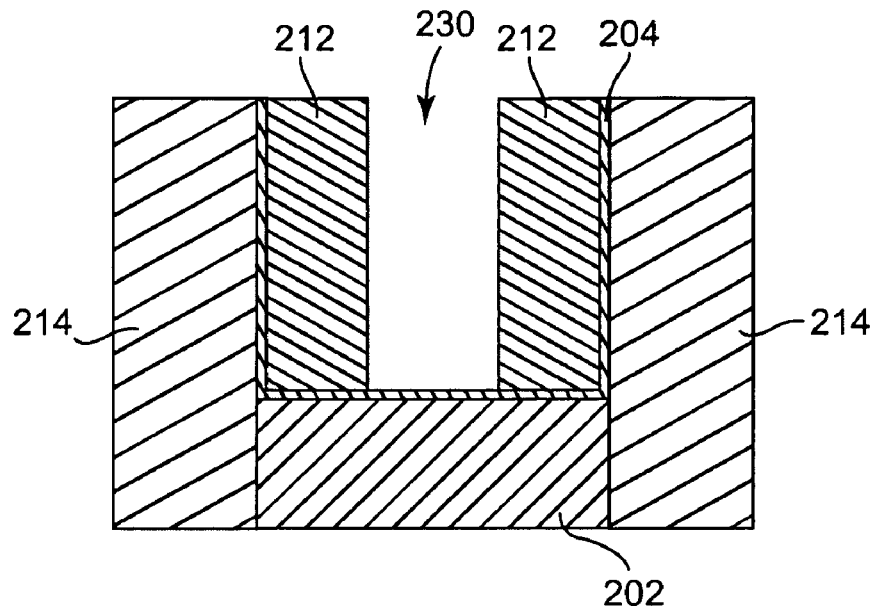
FIG. 15 illustrates a cross-sectional view of one embodiment of the first electrode, the electrode interface, and the spacer.

FIG. 15 illustrates a cross-sectional view of one embodiment of first electrode 202, electrode interface 204, and spacer 212. Sacrificial material 226b is selectively etched to provide opening 230 exposing a portion of electrode interface 204 above first electrode 202.

Figure 16:
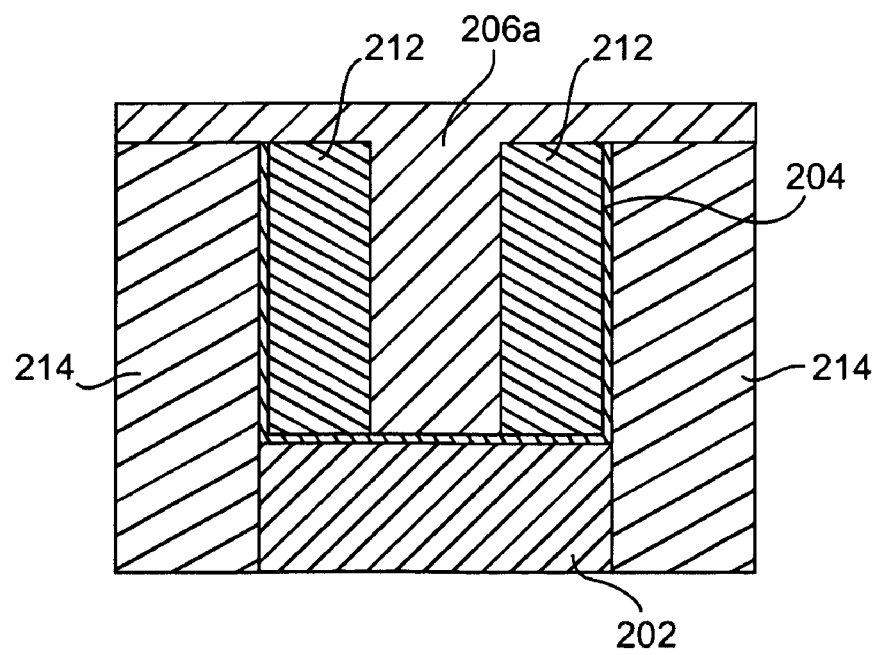
FIG. 16 illustrates a cross-sectional view of one embodiment of the first electrode, the electrode interface, the spacer, and a phase change material layer.

FIG. 16 illustrates a cross-sectional view of one embodiment of first electrode 202, electrode interface 204, spacer 212, and a phase change material layer 206a. A phase change material, such as a chalcogenide compound material or another suitable phase change material is deposited over exposed portions of electrode interface 204, spacers 212, and dielectric material 214 to provide phase change material layer 206a. Phase change material layer 206a is deposited using CVD, HDP-CVD, ALD, MOCVD, PVD, JVD, spin-on, or other suitable deposition technique.

Figure 17A:
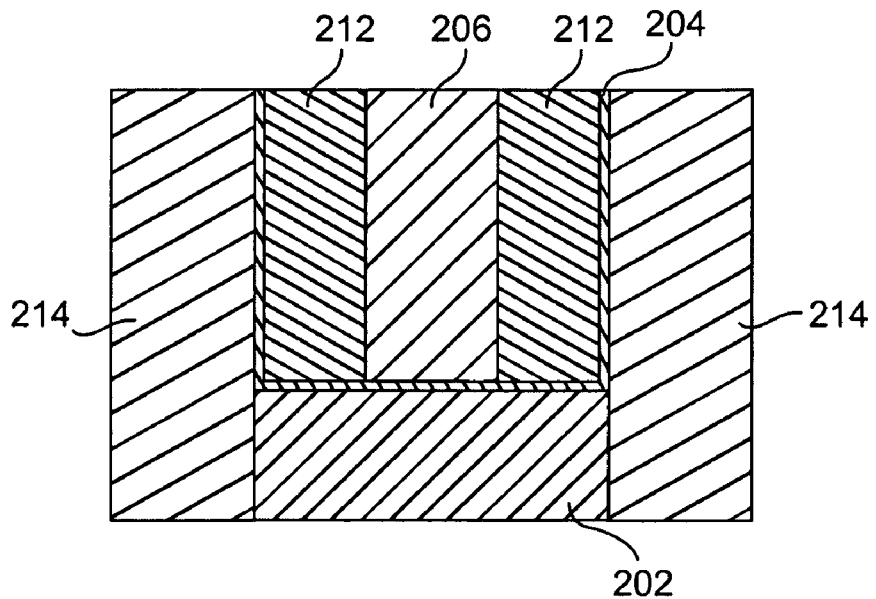
FIG. 17A illustrates a cross-sectional view of one embodiment of the first electrode, the electrode interface, the spacer, and a phase change element after planarization.
Figure 17B:
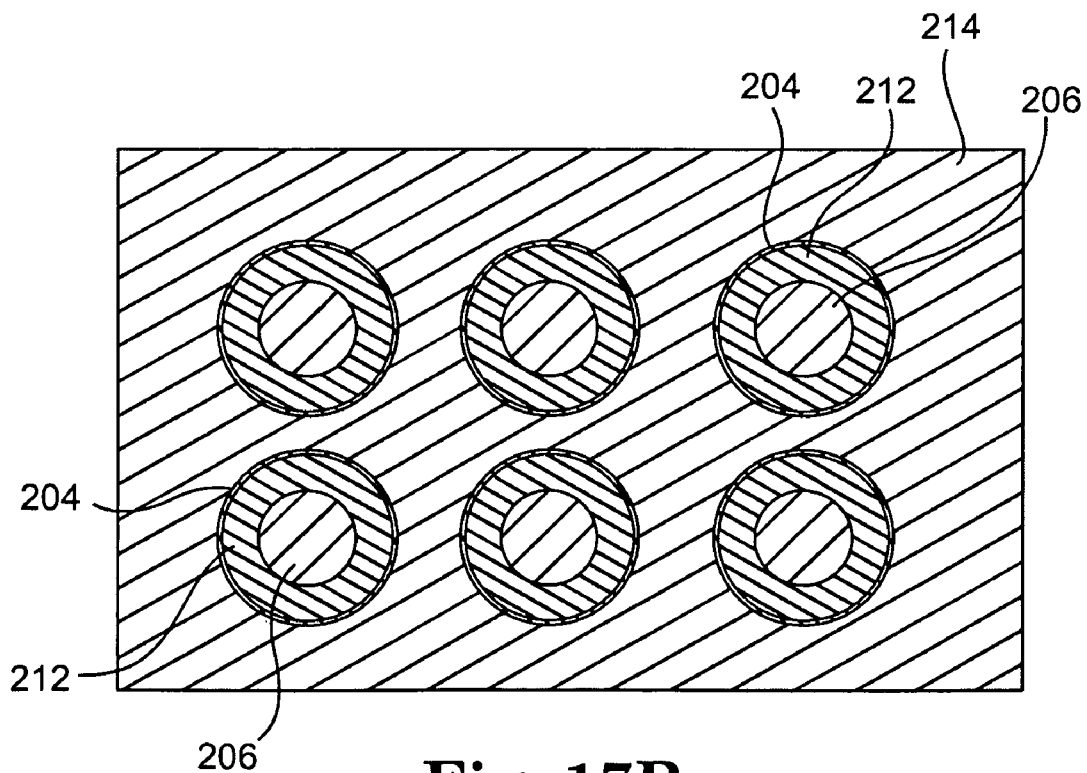
FIG. 17B illustrates a top view of one embodiment of the electrode interface, the spacer, and a phase change element after planarization.

FIG. 17A illustrates a cross-sectional view and FIG. 17B illustrates a top view of one embodiment of first electrode 202, electrode interface 204, spacer 212, and a phase change element 206 after planarization. Phase change material layer 206a is planarized to expose electrode interface 204, spacer 212, and dielectric material 214 to provide phase change element 206. Phase change material layer 206a is planarized using CMP or another suitable planarization technique. In one embodiment, phase change element 206 has a width between approximately 2 nm and 30 nm.

Figure 18A:
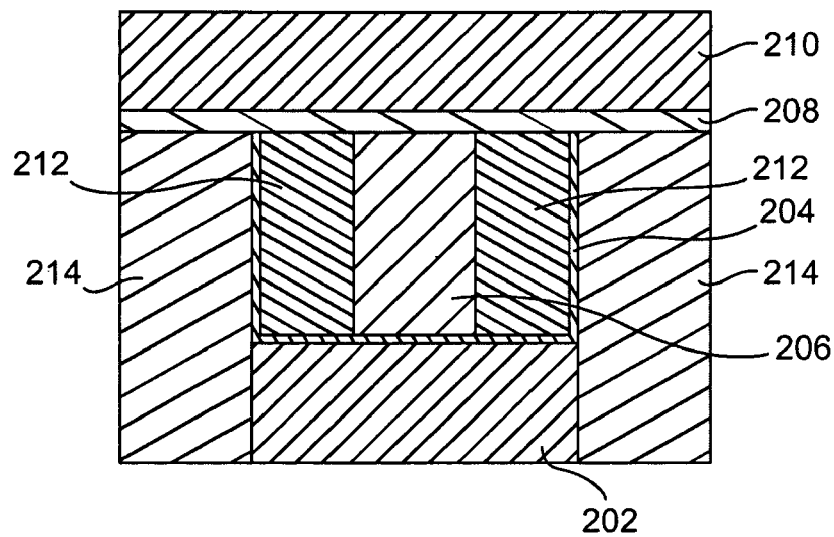
FIG. 18A illustrates a cross-sectional view of one embodiment of the first electrode, the electrode interface, the spacer, the phase change element, a second electrode, and a bit line.
Figure 18B:
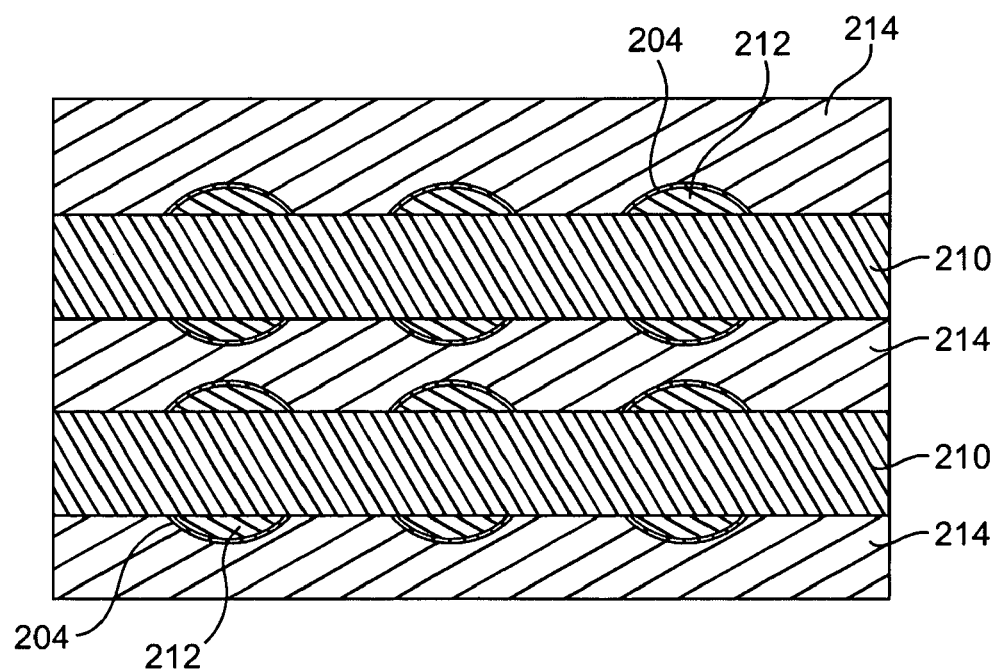
FIG. 18B illustrates a top view of one embodiment of the electrode interface, the spacer, and the bit line.

FIG. 18A illustrates a cross-sectional view and FIG. 18B illustrates a top view of one embodiment of first electrode 202, electrode interface 204, spacer 212, phase change element 206, a second electrode 208, and a bit line 210. An electrode material, such as TiN, TaN, W, Al, Ti, Ta, TiSiN, TaSiN, TiAlN, TaAlN, WN, C, Cu, or other suitable electrode material is deposited over exposed portions of electrode interface 204, spacer 212, phase change element 206, and dielectric material 214 to provide an electrode material layer. The electrode material layer is deposited using CVD, HDP-CVD, ALD, MOCVD, PVD, JVD, or other suitable deposition technique.

A bit line material, such as W, Cu, Al, or other suitable bit line material is deposited over the electrode material layer to provide a bit line material layer. The bit line material layer is deposited using CVD, HDP-CVD, ALD, MOCVD, PVD, JVD, or other suitable deposition technique. Portions of the bit line material layer and the underlying electrode material layer are then etched to expose portions of dielectric material 214 to provide bit line 210 and second electrode 208. In one embodiment, portions of the bit line material layer and the underlying electrode material layer are etched to expose portions of electrode interface 204, spacers 212, and dielectric material 214 to provide bit line 210 and second electrode 208.

Embodiments provide self-aligned memory cells fabricated using a single block mask and a damascene process. As such, the phase change element within each memory cell is not damaged by an etching process. Each phase change element is cylindrical-shaped, which reduces the reset current compared to mushroom and pore type phase change elements.

While the specific embodiments described herein substantially focused on using phase change memory elements, the embodiments can be applied to any suitable type of resistance or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first electrode;
a cup-shaped electrode interface coupled to the first electrode, the electrode interface comprising a bottom portion and a sidewall portion;
a dielectric spacer at least partially laterally enclosed by the electrode interface;
a resistance changing material laterally enclosed by the spacer and directly contacting the bottom portion of the electrode interface; and
a second electrode coupled to the resistance changing material and directly contacting the electrode interface.

2. The integrated circuit of claim 1, wherein a resistance of the electrode interface between the first electrode and the second electrode is greater than a resistance of the resistance changing material with the resistance changing material in a reset state.

3. The integrated circuit of claim 1, wherein the resistance changing material is substantially cylindrical-shaped.

4. The integrated circuit of claim 1, wherein a thickness of the electrode interface is less than a thickness of the spacer.

5. The integrated circuit of claim 1, wherein the resistance changing material comprises a phase change material.

6. The integrated circuit of claim 1, wherein the electrode interface comprises a heater material.

7. The integrated circuit of claim 1, wherein the electrode interface has a thickness between approximately 1 nm and 20 nm, and
wherein the resistance changing material has a width between approximately 2 nm and 30 nm.

8. An integrated circuit comprising:
a first electrode:
a cup-shaped electrode interface coupled to the first electrode;
a dielectric spacer at least partially laterally enclosed by the electrode interface;
a resistance changing material laterally enclosed by the spacer and contacting the electrode interface;
a second electrode coupled to the resistance changing material; and
a dielectric material contacting a top of the electrode interface, a bottom of the second electrode, and a sidewall of the spacer.

9. A system comprising:
a host; and
a memory device communicatively coupled to the host, the memory device comprising:
a first electrode;
a cup-shaped electrode interface coupled to the first electrode;
a first dielectric material at least partially laterally enclosed by the electrode interface;
a phase change element laterally enclosed by the first dielectric material and contacting the electrode interface; and
a second electrode coupled to the phase change element, wherein the electrode interface comprises a heater material.

10. The system of claim 9, wherein the electrode interface contacts the second electrode.

11. The system of claim 10, wherein a resistance of the electrode interface between the first electrode and the second electrode is greater than a resistance of the phase change element with the phase change element in a reset state.

12. The system of claim 9, wherein the memory device further comprises:
a second dielectric material contacting a top of the electrode interface, a bottom of the second electrode, and a sidewall of the first dielectric material.

13. The system of claim 9, wherein the electrode interface has a thickness between approximately 1 nm and 20 nm, and
wherein the phase change element has a width between approximately 2 nm and 30 nm.

14. The system of claim 9, wherein the memory device further comprises:
a write circuit configured for programming the phase change element;
a sense circuit configured for reading the phase change element; and
a controller configured for controlling the write circuit and the sense circuit.

15. A method for fabricating an integrated circuit, the method comprising:
providing a preprocessed wafer including a contact laterally surrounded by first dielectric material;
etching a portion of the contact to provide an opening and a first electrode;
depositing an electrode interface material on the first electrode and a sidewall of the first dielectric material in the opening;
fabricating a dielectric spacer on a sidewall of the electrode interface material in the opening such that the dielectrics, spacer does not directly contact the first dielectric material;
depositing resistance changing material in the opening on the spacer and over the electrode interface material; and
fabricating a second electrode coupled to the resistance changing material.

16. The method of claim 15, further comprising:
depositing a sacrificial material over the electrode interface material and spacer after fabricating the spacer;
planarizing the sacrificial material to expose the first dielectric material; and
removing the sacrificial material prior to depositing the resistance changing material.

17. The method of claim 16, wherein providing the preprocessed wafer comprises providing a preprocessed wafer including the contact laterally surrounded by the first dielectric material and a second dielectric material over the first dielectric material, the first dielectric material providing a stop for the planarizing of the sacrificial material.

18. The method of claim 15, further comprising:
oxidizing an upper portion of the electrode interface material between a sidewall of the spacer and the sidewall of the first dielectric material.

19. The method of claim 15, further comprising:
etching an upper portion of the electrode interface material between a sidewall of the spacer and the sidewall of the first dielectric material; and depositing a second dielectric material over the electrode interface material between the sidewall of the spacer and the sidewall of the first dielectric material.

20. The method of claim 15, wherein depositing the electrode interface material comprises depositing a heater material.

21. A method for fabricating a memory cell, the method comprising:
providing a preprocessed wafer including a contact laterally surrounded by first dielectric material;
etching a portion of the contact to provide a first electrode and an opening exposing a sidewall of the first dielectric material;
depositing an electrode interface material layer over exposed portions of the first dielectric material and the first electrode;
depositing a second dielectric material layer over the electrode interface material layer;
spacer etching the second dielectric material layer to provide a spacer on a sidewall of the electrode interface material layer in the opening;
depositing a sacrificial material over exposed portions of the electrode interface material layer and the spacer;
planarizing the sacrificial material and the electrode interface material layer to expose the first dielectric material and to provide a cup-shaped electrode interface;
removing the sacrificial material;
depositing phase change material over exposed portions of the first dielectric material, the electrode interface, and the spacer;
planarizing the phase change material to expose the first dielectric material; and
fabricating a second electrode contacting the phase change material.

22. The method of claim 21, wherein providing the preprocessed wafer comprises providing a preprocessed wafer including the contact laterally surrounded by the first dielectric material and a second dielectric material over the first dielectric material, the first dielectric material providing a stop for the planarizing of the sacrificial material.

23. The method of claim 21, further comprising:
oxidizing an upper portion of the electrode interface between a sidewall of the spacer and the sidewall of the first dielectric material.

24. The method of claim 21, further comprising:
etching an upper portion of the electrode interface between a sidewall of the spacer and the sidewall of the first dielectric material; and
depositing a third dielectric material over the electrode interface between the sidewall of the spacer and the sidewall of the first dielectric material.

* * * * *